United States Patent
Thuy et al.

(10) Patent No.: US 8,150,045 B2
(45) Date of Patent: Apr. 3, 2012

(54) AUTOMATIC GAIN CONTROL SYSTEM APPLIED TO AN AUDIO SIGNAL AS A FUNCTION OF AMBIENT NOISE

(75) Inventors: Vu Hoang Co Thuy, Ozoir la Ferriere (FR); Benoit Pochon, Paris (FR)

(73) Assignee: Parrot, Paris (FR)

( * ) Notice: Subject to any disclaimer, the term of this patent is extended or adjusted under 35 U.S.C. 154(b) by 407 days.

(21) Appl. No.: 12/471,618

(22) Filed: May 26, 2009

(65) Prior Publication Data

US 2009/0304191 A1 Dec. 10, 2009

(30) Foreign Application Priority Data

Jun. 4, 2008 (FR) ..................... 08 03087

(51) Int. Cl.
*H03G 3/20* (2006.01)
(52) U.S. Cl. ............. 381/57; 381/71.1; 381/92
(58) Field of Classification Search ............ 381/57, 381/92, 94.1, 71.1, 71.12, 71.4, 106, 107, 381/108; 704/219
See application file for complete search history.

(56) References Cited

U.S. PATENT DOCUMENTS

| 7,171,003 B1 | 1/2007 | Venkatesh et al. |
| 2007/0276660 A1 * | 11/2007 | Pinto ............... 704/219 |

FOREIGN PATENT DOCUMENTS

WO 0189184 A1 11/2001

OTHER PUBLICATIONS

Cohen, Israel et al., "Noise Estimation by Minima Controlled Recursive Averaging for Robust Speech Enhancement", IEEE Signal Processing Letters, vol. 9 No. 1, Jan. 2002,p. 12-15.
Schwab, Markus et al., "Robust Noise Estimation Applied to Different Speech Estimators", Department of Communication Systems Technical University of Berlin,Germany, Jan. 2003, p. 1904-1907.
Fan, Ningping et al.,"Speech Noise Estimation Using Enhanced Minima Controlled Recursive Averaging",Siemens Corporate Research Inc., Jan. 2007, XP-002511252,IEEE Xplore, p. 581-584.

* cited by examiner

*Primary Examiner* — Minh-Loan T Tran
*Assistant Examiner* — Fazli Erdem
(74) *Attorney, Agent, or Firm* — Haverstock & Owens LLP

(57) ABSTRACT

An automatic gain control system applied to a audio signal as a function of the ambient noise, the system comprising: an ambient noise estimator module suitable for establishing a current noise value estimated at least from a signal provided by a microphone; and an automatic gain control module suitable for applying to the audio signal gain of a value that is determined as a function of the current noise value received from the ambient noise estimator module. According to the invention, the ambient noise estimator module comprises an MCRA estimator suitable for establishing the current noise value from a signal provided by the microphone picking up the real noise, the echo of the music, and where appropriate speech. The system also includes a module for estimating the power of the audio signal and suitable for providing the automatic gain control module with a current power value for the audio signal.

9 Claims, 1 Drawing Sheet

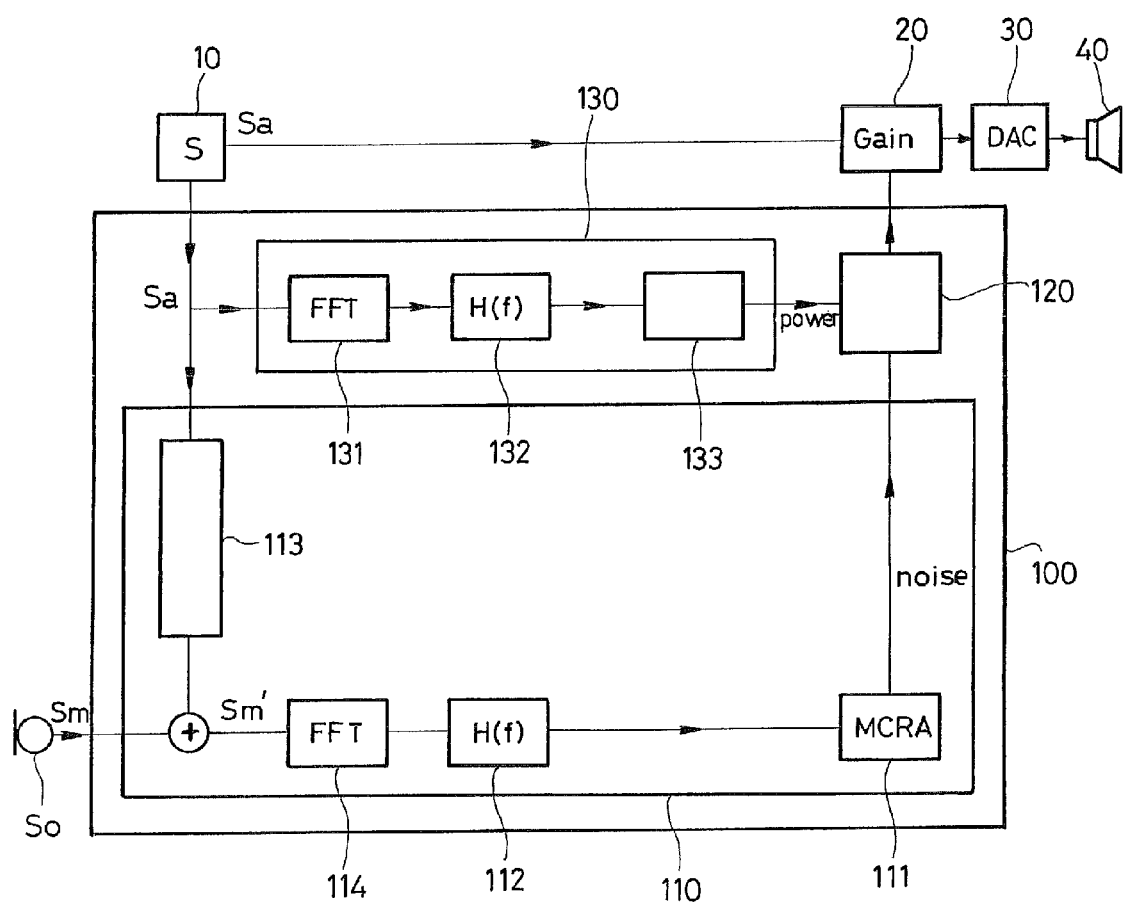

AUTOMATIC GAIN CONTROL SYSTEM APPLIED TO AN AUDIO SIGNAL AS A FUNCTION OF AMBIENT NOISE

The invention relates to an automatic gain control system applied to an audio signal as a function of ambient noise.

BACKGROUND OF THE INVENTION

A particularly advantageous application of the invention lies in the field of audio equipment, in particular audio equipment having an incorporated microphone, such as car radios provided with a "hands-free" telephony function. FR 2 890 513 A1 (Parrot) describes such a car radio having a front face that includes two microphones suitable for picking up the voice of the driver for telephone conversation, and possibly also for voice commands.

In this context, the invention seeks more particularly to improve listening to music programs, regardless of whether they are produced by a source of the audio equipment operating in "streaming" mode, by a signal applied to the "line-in" input of the appliance, or by radio broadcast signals.

A user listening to such programs, e.g. a person present in a motor vehicle fitted with a "hands-free" car radio, is strongly influenced by the sound level of the ambient noise surrounding the user. It is therefore desirable to be able to adapt the sound volume of the useful audio signal to the volume of ambient noise by automatically increasing or decreasing volume as a function of corresponding variations in ambient noise.

In this respect, the presence of a microphone in the audio equipment is particularly appropriate since, in addition to its main function dedicated to "hands-free" communication, the microphone can also perform another function, namely that of measuring the level of ambient noise and variations therein in order to deduce automatically therefrom the gain that ought to be applied to the audio signal, and to adjust the useful volume to a level that provides the user with the same listening comfort regardless of the sound environment surrounding the user.

Nevertheless, the use of a microphone as an ambient noise sensor presents a difficulty associated with the fact that the microphone is capable also of sensing the echo of the music played back by the loudspeakers and the voices of people present in the vehicle.

These two elements should not be considered as ambient noise. For example, it will be understood that if the level of the music increases in the vehicle, the power of the sound signal sensed by the microphone will increase correspondingly by the echo effect. If this increase were to be considered as noise, then the gain applied of the audio signal would itself be increased, thereby simultaneously increasing the level of the music and thus once more increasing the power of the echo sensed by the microphone. This can lead to a diverging loop.

The same applies to the voices of people. If a conversation is taking place on board the vehicle, the corresponding increase in the power sensed by the microphone must not be considered as an increase in ambient noise that might lead to an automatic increase in the gain of the audio signal, since that increase would impede the conversation (already disturbed by the ambient noise), which would be contrary to the desired objective.

Concerning the problem associated with acoustic echo, systems are known in the state of the art for performing automatic volume control while eliminating acoustic echo from the sound signal picked up by the microphone.

For example, U.S. Pat. No. 6,868,162 A1 describes such an automatic gain control system in which the audio signal is processed by an adaptive filter, and is then subtracted from the signal detected by the microphone, with the resulting error signal providing an estimate of the ambient noise.

In another system, proposed in WO 01/89184 A1, an estimate for the current noise value is established periodically, directly from the signal delivered by the microphone after subtraction of the echo-canceling signal.

Nevertheless, it should be observed that implementing an echo canceller requires significant computation resources for the processor that is processing the signal. Thus, although using a device of that type leads to a better estimation of ambient noise, it should be considered as being optional and suitable for use only by equipment having sufficient computation resources.

Concerning the problem associated with the voices of people, there is nothing in the present state of the art that provides a solution for eliminating those voices from the signal sensed by the microphone.

OBJECT AND SUMMARY OF THE INVENTION

Thus, an object of the invention is to propose an automatic gain control system that makes it possible in effective and simple manner to extract the speech signal associated with the voices of people present in the vehicle from the signal that is detected by the microphone, thereby improving the estimation of ambient noise that is used as a basis for automatically controlling volume.

In accordance with the invention, this object is achieved by a system for automatically controlling the gain applied to an audio signal as a function of ambient noise, the system being of the same generic type as that described in above-mentioned WO 01/89184 A1, and comprising:

an ambient noise estimator module suitable for establishing a current noise value estimated at least from a signal provided by a microphone; and an automatic gain control module suitable for applying to the audio signal gain of a value that is determined as a function of the current noise value received from the ambient noise estimator module.

According to the invention, the ambient noise estimator module comprises an MCRA estimator suitable for establishing the current noise value from a signal provided by the microphone sensing the real noise, the echo of the music, and speech if any, the system further comprising a module for estimating the power of the audio signal and suitable for providing the automatic gain control module with a current power value for the audio signal.

The MCRA estimator implemented by the invention is constituted, for example, by that described in WO 2007/099222 A1 (Parrot) as a device for processing an audio signal to eliminate noise from a noisy audio signal comprising a speech component in combination with a noise component, the purpose being to obtain a speech signal that is noise-free.

That estimator relies on an algorithm known as minima controlled recursive averaging (MCRA) and described in the article I. Cohen and B. Berdugo entitled *Noise estimation by minima controlled recursive averaging for robust speech enhancement,* IEEE Signal Processing Letters, Vol. 9, No. 1, pp. 12-15, January 2002.

It is important to emphasize that the present invention uses the MCRA estimator for a purpose that is completely different from that of eliminating the noise from a speech signal, and specifically for the opposite purpose of extracting the ambient noise from a signal that contains a speech signal.

The processing method described in above-mentioned WO 2007/099222 A1 includes an intermediate step of estimating ambient noise using the MCRA algorithm, with the signal as estimated in this way for the ambient noise being subtracted from the total signal in order to extract the speech signal therefrom. That step is advantageously used by the automatic gain control system in accordance with the invention for determining the ambient noise component on its own after the speech component has been eliminated.

Concerning the module for estimating the power of the audio signal, the description below explains in greater detail the advantage of this disposition in the context of the automatic gain control module processing the ambient noise signal in the absence of an echo canceller circuit.

Advantageously, the module for estimating ambient noise and the module for estimating the power of the audio signal include respective perception filters. This makes it possible to stimulate the frequency response as well as possible as a function of the user's perception concerning ambient noise.

As mentioned above, it is possible to obtain an even more accurate estimate of ambient noise if, in accordance with the invention, the ambient noise estimator module includes a circuit for canceling the audio signal echo that is present in the signal delivered by the microphone.

Concerning automatic gain control proper, in the invention the automatic gain control module comprises: means for initially executing an initialization step with reference to a predetermined minimum threshold for ambient noise; means for subsequently executing a gain-change step; and means for applying to the audio signal the gain value as established at the end of the gain-change step.

Said initialization step comprises:
a step of starting the method, consisting in estimating a current noise value and in executing the following step for determining a reference noise as soon as a current noise value is greater than said noise threshold; and
a step for determining a reference noise for changing gain, consisting in establishing a reference value for the ambient noise if the current noise value has remained above the ambient noise threshold for a first determined duration, a return being made to the initialization step as soon as a current noise value becomes less than the noise threshold.

Said gain-change step consists in:
calculating the difference between the current noise value and the ambient noise reference value;
applying to the gain a variation that is established as a function of said difference when said difference remains greater than a high threshold or less than a low threshold concerning gain change for a second determined duration; and
establishing a new reference value for the ambient noise, and returning to the gain-change step; and
said gain-change step being interrupted with a gain reduction being applied as soon as a current noise value becomes less than the noise threshold.

Finally, the invention also provides audio equipment including an audio signal source and a microphone, the equipment further including an automatic gain control system as described above.

BRIEF DESCRIPTION OF THE DRAWING

There follows a description of an embodiment of the device of the invention given with reference to accompanying FIG. 1, which is a block diagram of audio equipment including gain automatic gain control system of the invention.

FIG. 1 shows audio equipment, e.g. a car radio including a "hands-free" communications function. For this purpose, the audio equipment of FIG. 1 includes a microphone 50 having the primary function of enabling "hands-free" communication to be performed.

MORE DETAILED DESCRIPTION

The audio equipment of FIG. 1 further includes a source 10 suitable for providing a digital audio signal $S_a$ from radio broadcasting or from any other broadcasting means, e.g. from "streaming" or from a signal applied to the "line-in" input of the appliance. A variable-gain amplifier 20 enables the user to adjust the volume of the signal delivered by one or more loudspeakers 40 after conversion by a digital-to-analog converter 30.

In FIG. 1, it can be seen that the audio equipment also includes an automatic gain control system 100 for controlling the gain of the amplifier 20 as a function of ambient noise. It is recalled that the ambient noise in question here is the noise as detected by the microphone 50 and having extracted therefrom the speech signal relating to the voices of people present in a vehicle cabin, for example, and also the echo of the signal delivered by the loudspeakers 40 and picked up by the microphone 50. Nevertheless, acoustic echo canceling must be considered as being optional since it depends strongly on the computation resources of the processor of the audio equipment.

As shown in FIG. 1, the automatic gain control system 100 includes a module 110 for estimating ambient noise and having the purpose of establishing a value noise for the current noise that is estimated from the signal $S_m$ supplied by the microphone 50. This current noise value noise is delivered to an automatic gain control module 120 that determines the corresponding gain value that ought to be applied by the amplifier 20 to the audio signal $S_a$ so as to maintain satisfactory listening comfort, whatever the level of ambient noise.

In the embodiment of FIG. 1, the ambient noise estimator module 110 comprises an MCRA estimator 111 designed to deliver a value noise for the current noise contained in the signal $S_m$ picked up by the microphone 50. In order to make the MCRA estimator, the signal $S_m$ picked up by the microphone 50 is processed in conventional manner by a stage 114 for calculating a fast Fourier transform on each frame of the microphone signal $S_m$, e.g. having a duration of 20 ms.

In the particular example of FIG. 1, the signal $S_m$' results from the signal $S_m$ being processed by a circuit 113 for canceling the echo from the audio signal $S_a$ present in the signal $S_m$. Although highly recommended, the presence of this circuit 113 in the ambient noise estimator module 110 nevertheless remains optional and it can be envisaged only if the computation resources of the audio equipment are sufficient, as mentioned above.

An MCRA estimator is described in above-mentioned WO 2007/099222 A1 and in the article by I. Cohen and B. Berdugo, likewise mentioned above.

The ambient noise estimator module 110 further includes, upstream from the MCRA estimator 111, a perception filter 112 defined so as to take account of the perception frequency response of the user while it is estimating ambient noise. This filter is applied after the spectrum has been estimated by the Fourier transform of the module 114.

It can be seen in FIG. 1 that the automatic gain control system 100 also includes a module 130 for estimating the power of the audio signal, suitable for delivering a value power to the automatic gain control module 120 that is representative of the current power of the audio signal $S_a$. The advantage of this power estimator module in the absence of an acoustic echo canceller circuit, is explained below.

In conventional manner, the module 130 for estimating the power of the audio signal $S_a$ comprises a stage 131 for calculating a Fourier transform for each frame of the audio signal $S_a$, e.g. each frame of 20 ms duration, and a stage 133 for calculating the power in dB by summing the components squared of the frequency spectrum of the signal. FIG. 1 also shows the presence of a perception filter 132 between the stages 131 and 133 that is analogous to the perception filter 132, for the purpose of applying the same user perception relationship to both the ambient noise estimator module and to the audio signal power estimator module.

The value of the gain to be applied to the audio signal by the amplifier 20 as a function of the ambient noise is determined by the automatic gain control module 120 in application of operations characterized by two major steps, namely an initialization step (1) and a gain-change step (2) that are described below in metalanguage:

(1) Initialization Step
(1a) Starting Step
    if (noise≧init_thresh), ref_noise=noise, wait 2 s, count=0, goto (1b)
    else wait 2 s, go to (1a)
(1b) Step of Determining a Reference Noise
    if (noise<init−thresh), wait 2 s, goto (1a)
    if (|noise−ref_noise|≧init_dyn thresh), ref_noise=noise, wait 2 s, count=0, goto (1b)
    else count++,
    if (count==Nb_count), make_ref, wait 2 s, Power_count=0, goto (2)
    else wait 2 s, goto (1b)
(2) Gain-Change Step
    if (Power_comp), Power_count++
    if Power_count==Nb_Power_count, wait 4 s, goto (3)
    if (noise<init_thresh), apply_gain, wait 4 s, goto (3)
    else if ((noise−Ref_Noise)>thresh_hi), hi_count++, lo_count=0
    else if ((noise−Ref_Noise)<thresh_lo), lo_count++, hi_count=0
    else hi_count=0, lo_count=0
    if (lo_count==Nb_lo_count) or (hi_count==Nb_hi_count), apply_gain, wait 4 s, goto (3)
    else Power_count=0, wait 2 s, goto (2)
(3) Final Step
    if (noise≧init_thresh), make_ref, Power_count=0, wait 2 s, goto (2)
    else wait 2 s, goto (1a)

The initialization step (1) is the step that is always executed whenever the automatic gain control system is activated, e.g. when the audio equipment is switched on.

This initialization itself comprises two steps, a starting step (1a) and a step (1b) of determining a noise reference relative to which the gain change conditions are established when executing step (2).

The purpose of the starting step (1a) is to trigger automatic volume control only when the detected noise level is greater than a certain threshold. One of the reasons for this option is that it is desirable to avoid changing volume, e.g. when the user is traveling in town with noise conditions that are generally low but continuously varying because of starting and slowing down as a result of traffic.

The current value noise for the current noise, as provided by the estimator 111 is thus compared by the automatic gain control module 120, e.g. once every 2 seconds, with a predetermined minimum noise threshold init_thresh. The following step (1b) is undertaken only if the condition noise≧init_thresh is satisfied. Under such circumstances, a temporary noise reference value Ref_Noise is taken as being equal to the current noise value noise.

As mentioned above, a particular object of the gain-change step (1b) is to define a reference value Ref_Noise for the ambient noise, relative to which changes of volume are adjusted during step (2).

Initially, and systematically, it is verified that the current noise noise remains not less than the threshold init_thresh. If this condition is not true, then the starting step (1a) is repeated, e.g. after a delay of 2 seconds.

In contrast, if the condition is true, then a new condition is imposed that consists in ensuring that the current noise noise does not vary excessively relative to the temporary noise reference ref_noise over a fairly long duration: this positive or negative variation should not exceed a certain threshold (cf. step (1b) that makes use of the absolute value of the difference: if the current noise noise is too great or too small, the algorithm reacts in the same way).

This avoids taking account of situations in which ambient noise increases (or decreases) too much or for a short time only. This applies in particular when, in the absence of acoustic echo cancellation, the music itself could be detected as being noise, e.g. when a music program starts.

If the absolute value |noise_ref noise| is greater than or equal to a determined dynamic noise threshold init_dys_thresh, step (1b) is returned to after a delay of 2 seconds, for example. Otherwise, a counter count is incremented (operation "count++") and this value is compared with a count threshold Nb_count.

If count is less than Nb_count, step (1b) is returned to after a delay of 2 seconds, for example.

If the counter count is equal to Nb_count, that means, that the above conditions relating to a reference noise Ref_Noise being established (operation "make_ref") continue to be true over quite a long duration, equal to x*(Nb_count−1) seconds, where x is the duration of the delay, specifically 2 seconds in the above example.

The operation "make_ref" corresponds to calculating the reference value Ref_Noise for the ambient noise, this calculation being performed by taking the current noise value noise as smoothed by a first order filter. More precisely, if noise(n) is the value of the current noise at instant n, then a smooth noise value is calculated continuously in application of the following formula:

$$\text{Smooth\_Noise}(n) = \alpha.\text{Smooth\_Noise}(n-1) + (1-\alpha).\text{noise}(n)$$

where $\alpha$ is an adjustable weighting coefficient that is less than or equal to 1. The operation "make_ref" consists in applying:

$$\text{Ref\_Noise} = \text{Smooth\_Noise}$$

This "make_ref" operation also serves to calculate a reference value Ref_Power for the power of the audio signal $S_a$ in a manner equivalent to calculating the reference noise. If Power(n) is the value of the current power as estimated at instant n by the module 130, then the smoothed power value with first order filtering is calculated continuously by the following formula:

$$\text{Smooth\_Power}(n) = \beta.\text{Smooth\_Power}(n-1) + (1-\beta).\text{noise}(n)$$

where $\beta$ is an adjustable weighting coefficient that is less than or equal to 1. The operation "make_ref" then consists in applying:

$$\text{Ref\_Power} = \text{Smooth\_Power}$$

Gain-change step (2) is the step in which, the gain is actually applied to the audio signal Sa as a function of variations in ambient noise.

As explained above, the echo of the audio signal must not be interpreted as noise. That is why, in the absence of echo cancellation, it is necessary to prevent gain being applied if the signal varies for a long time above a threshold. For this purpose, the absolute value X of the difference between the estimated power power(m) at an instant m and the latest reference value Ref_Power(n) as calculated at instant n<m is calculated as follows:

$$X=|power(m)-Ref\_Power(n)|$$

If X is greater than a threshold power power_dyn_thresh for the dynamic range of the power, then the condition "If (Power_comp)" is satisfied and a Power_count counter is incremented (operation "Power_count++"). If the counter is equal to a threshold Nb_Power_count, that means that the signal has been varying above a maximum threshold over a duration equal to 2. (Nb_Power_count−1) seconds. Under such circumstances, step (2) is interrupted, e.g. after 4 seconds, in order to execute step (3) in which, if the current noise noise is greater than or equal to the threshold init_thresh, new references are established (operation "make_ref") with a return to the gain-change step (2). If the current noise noise is less than the threshold init_thresh, a return is made to initialization step (1).

When the counter Power_count is less than the threshold Nb_Power_count, it is verified that the ambient noise noise is still greater than or equal to the minimum threshold init_thresh. If it is not, then a decrease in gain is applied relative to the observed decrease in noise, and step (3) is executed, e.g. after a delay of 4 s.

If the ambient noise noise is greater than or equal to the minimum threshold init_thresh, then it is verified whether it has varied a great deal relative to the reference noise Ref_Noise determined during step (1b).

If the difference between the ambient noise noise and the reference noise Ref_Noise is greater than a given threshold thresh_hi, then a counter hi_count is incremented (operation "hi_count++").

Likewise, if the difference between the ambient noise noise and the reference noise Ref_Noise is less than a given threshold thresh_lo, then another counter lo_count is incremented (operation "lo_count++").

Thereafter, each of these counters is compared with a respective threshold Nb_hi_count and Nb_lo_count. If one of the comparisons is positive, that means that the noise noise has remained for a sufficient length of time above or below the reference noise Ref_Noise to decide to apply gain to the audio signal that is appropriate for the observed noise difference (operation "apply_gain").

The gain is modified as follows.

If the current noise noise(m) has increased by x dB compared with the latest reference noise Ref_noise(n) (m>n), it can be decided to increase the gain by x dB likewise, by default. However, this multiplier factor may be varied at will, and the gain may be increased by 2.x dB, for example.

If the gain is to from y dB to z dB, this increase may be performed over one second, for example, using a linear progression of slope that depends on y and z.

Otherwise, if the current noise is below the reference noise, then the process is the same, except that the slope of the curve is negative.

What is claimed is:

1. An automatic gain control system applied to a audio signal as a function of the ambient noise, the system comprising:
    a variable-gain amplifier receiving said audio signal and suitable to adjust the volume of a signal outputted by a loudspeaker,
    an ambient noise estimator module suitable for establishing a current noise value estimated at least from a signal provided by a microphone; and
    an automatic gain control module suitable for determining a gain value to be applied by said amplifier to said audio signal;
    wherein:
    the ambient noise estimator module comprises an MCRA estimator suitable for extracting, from the signal provided by said microphone including real noise, echo of the audio signal and speech if any, a value of the ambient noise component on its own after the speech component has been eliminated; and
    the system further comprises a module for estimating the power of the audio signal and suitable for providing the automatic gain control module with a current power value for the audio signal.

2. The system according to claim 1, wherein the ambient noise estimator module and the module for estimating the power of the audio signal include respective perception filters.

3. The system according to claim 1, wherein the ambient noise estimator module includes a circuit for canceling the echo from the audio signal present in the signal delivered by the microphone.

4. The system according to claim 1, wherein the automatic gain control module comprises:
    means for initially executing an initialization step 1) with reference to a predetermined minimum threshold for ambient noise;
    means for subsequently executing a gain-change step 2); and
    means for applying to the audio signal the gain value established at the end of the gain-change step 2);
    said initialization step 1) comprising:
        a step 1a) of starting the method, consisting in estimating a current noise value and in executing the following step 1b) for determining a reference noise as soon as a current noise value is greater than the noise threshold; and
        a step 1b) for determining a reference noise for changing gain, consisting in establishing a reference value for the ambient noise if the current noise value has remained above the ambient noise threshold for a first determined duration, a return being made to initialization step 1) as soon as a current noise value becomes less than the noise threshold;
    said gain-change step 2) consisting in:
        calculating the difference between the current noise value and the ambient noise reference value;
        applying to the gain a variation that is established as a function of said difference when said difference remains greater than a high threshold or less than a low threshold concerning gain change for a second determined duration; and
        establishing a new reference value for the ambient noise, and returning to the gain-change step; and
    said gain-change step 2) being interrupted with a gain reduction being applied as soon as a current noise value becomes less than the noise threshold.

5. The system according to claim 4, wherein the starting step 1a) also consists in determining a temporary noise reference value, and wherein the reference noise determination step 1b) is interrupted as soon as the absolute value of the difference between a current noise value and the temporary noise reference value remains greater than a noise dynamic range threshold for the first duration.

6. A system according to claim 4, wherein the reference noise determination step 1b) also consists in determining a reference value for the audio signal power, and wherein gain-change step 2) is interrupted if the absolute value of the difference between the current power value of the audio signal and the reference power value has remained greater than a power dynamic range threshold for a third determined duration, with a return to gain-change step 2) if the current noise value is greater than the noise threshold, else to initialization step 1).

7. The system according to claim 4, wherein the ambient noise reference value is equal to the current noise value smoothed by a first order filter.

8. The system according to claim 6, wherein the audio signal power reference value is equal to the current power value of the audio signal smoothed by a first order filter.

9. Audio equipment including an audio signal source and a microphone, further including an automatic gain control system according to claim 1.

* * * * *